(12) United States Patent
Moon et al.

(10) Patent No.: US 12,002,537 B2
(45) Date of Patent: Jun. 4, 2024

(54) PRE-DECODER CIRCUITY (71) Applicant: Micron Technology, Inc., Boise, ID (US)

(72) Inventors: Byung S. Moon, Plano, TX (US); Ramachandra Rao Jogu, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 17/831,290

(22) Filed: Jun. 2, 2022

(65) Prior Publication Data
US 2023/0395104 A1 Dec. 7, 2023

(51) Int. Cl.
*G11C 7/10* (2006.01)
(52) U.S. Cl.
CPC .......... *G11C 7/1039* (2013.01); *G11C 7/1012* (2013.01); *G11C 7/1063* (2013.01); *G11C 7/109* (2013.01)
(58) Field of Classification Search
None
See application file for complete search history.

(56) References Cited

U.S. PATENT DOCUMENTS

| 7,123,500 | B2 | 10/2006 | Ye et al. | |
|---|---|---|---|---|
| 8,351,264 | B2* | 1/2013 | Chevallier | G11C 8/08 365/185.23 |
| 10,553,575 | B2 | 2/2020 | Tien et al. | |
| 2007/0279999 | A1* | 12/2007 | Watanabe | G11C 16/3477 365/185.23 |
| 2021/0391328 | A1 | 12/2021 | Sio et al. | |

* cited by examiner

*Primary Examiner* — Ajay Ojha
(74) *Attorney, Agent, or Firm* — Brooks, Cameron & Huebsch, PLLC (57) ABSTRACT

The present disclosure includes apparatuses, methods, and systems for pre-decoder circuitry. An embodiment includes a memory array including a plurality of memory cells, decoder circuitry coupled to the memory array, wherein the decoder circuitry comprises a first n-type transistor having a first gate and a second n-type transistor having a second gate, and pre-decoder circuitry configured to provide a bias condition for the first gate and second gate to provide a selection signal to one of the plurality of memory cells, wherein the bias condition comprises: a positive voltage for the first gate and a negative voltage for the second gate for a positive configuration for the memory cells, and zero volts for the first gate and the negative voltage for the second gate for a negative configuration for the memory cells.

20 Claims, 6 Drawing Sheets

__PRE-DECODER CIRCUITRY__

TECHNICAL FIELD

The present disclosure relates generally to semiconductor memory and methods, and more particularly, to pre-decoder circuitry.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

The present disclosure includes apparatuses, methods, and systems for pre-decoder circuitry. An example apparatus includes a memory array including a plurality of memory cells, decoder circuitry coupled to the memory array, wherein the decoder circuitry comprises a first n-type transistor having a first gate and a second n-type transistor having a second gate, and pre-decoder circuitry configured to provide a bias condition for the first gate and second gate to provide a selection signal to one of the plurality of memory cells, wherein the bias condition comprises a positive voltage for the first gate and a negative voltage for the second gate for a positive configuration for the memory cells, and zero volts for the first gate and the negative voltage for the second gate for a negative configuration for the memory cells.

Previous memory apparatuses have utilized decoder circuitry including one p-type transistor and one n-type transistor (1P1N bi-polar decoders) to provide selection and de-selection signals for programming and sensing memory cells (e.g., resistance variable memory cells). These 1P1N bi-polar decoders may have eight configuration modes: four positive configuration modes, where one positive configuration mode corresponds to a selection signal and three positive configuration modes correspond to de-selection signals; and four negative configuration modes, where one negative configuration mode corresponds to a selection signal and three negative configuration modes correspond to de-selection signals. These 1P1N bi-polar decoders exhibit significant power consumption because the gate biases of each of the unselected 1P1N bi-polar decoders (e.g., corresponding to the de-selection signals) changes during polarity transitions.

Embodiments of the present disclosure, however, may utilize decoder circuitry including two n-type transistors (2N bi-polar decoders) to provide such selection and de-selection signals, which can provide reduced power consumption, as compared to previous apparatuses that utilize 1P1N bi-polar decoders, because the gate biases of each of the unselected 2N bi-polar decoders does not change during polarity transitions. For example, the 2N bi-polar decoders can have eight configuration modes: four positive configuration modes, where one positive configuration mode corresponds to a selection signal and three positive configuration modes correspond to de-selection signals; and four negative configuration modes, where one negative configuration mode corresponds to a selection signal and three negative configuration modes correspond to de-selection signals. For two of the unselected 2N bi-polar decoders (e.g., corresponding to the de-selection signals) the gate voltages do not change during polarity transitions, and for the third of the unselected 2N bi-polar decoders only one of the two gate voltages changes during polarity transitions.

As an example for the 2N bi-polar decoders (which also have supply voltages provided thereto), a first positive configuration mode corresponding to a de-selection signal can have a first gate bias condition of −3.4 volts (V) and a second gate bias condition of 2.5 V, a second positive configuration mode corresponding to a de-selection signal can have a first gate bias condition of 5.5 V and a second gate bias condition of −3.4 V, and a third positive configuration mode corresponding to a de-selection signal can have a first gate bias condition of −3.4 V and a second gate bias condition of 2.5 V; and a first negative configuration mode corresponding to a de-selection signal can have a first gate bias condition of −3.4 V and a second gate bias condition of 2.5 V, a second negative configuration mode corresponding to a de-selection signal can have a first gate bias condition of 0 V and a second gate bias condition of −3.4 V, and a third negative configuration mode corresponding to a de-selection signal can have a first gate bias condition of −3.4 V and a second gate bias condition of 2.5 V. For this example, only the first gate bias condition is varied from the second positive configuration mode corresponding to a de-selection signal value of 5.5 V to the second negative configuration mode corresponding to a de-selection signal value of 0 V. In other words, for the first positive configuration mode and the first negative configuration mode the same first and second gate bias conditions (−3.4 V and 2.5 V) are utilized, for the third positive configuration mode and the third negative configuration mode the same first and second gate bias conditions (−3.4 V and 2.5 V), and for the second positive configuration mode and the second negative configuration mode the same second gate bias condition (−3.4 V) is utilized. While particular bias condition values are discussed herein as examples, embodiments are not limited to these values. The pre-decoder circuitry disclosed herein can provide the first gate bias conditions and the second gate bias conditions corresponding to the selection signals and de-selection signals.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1:
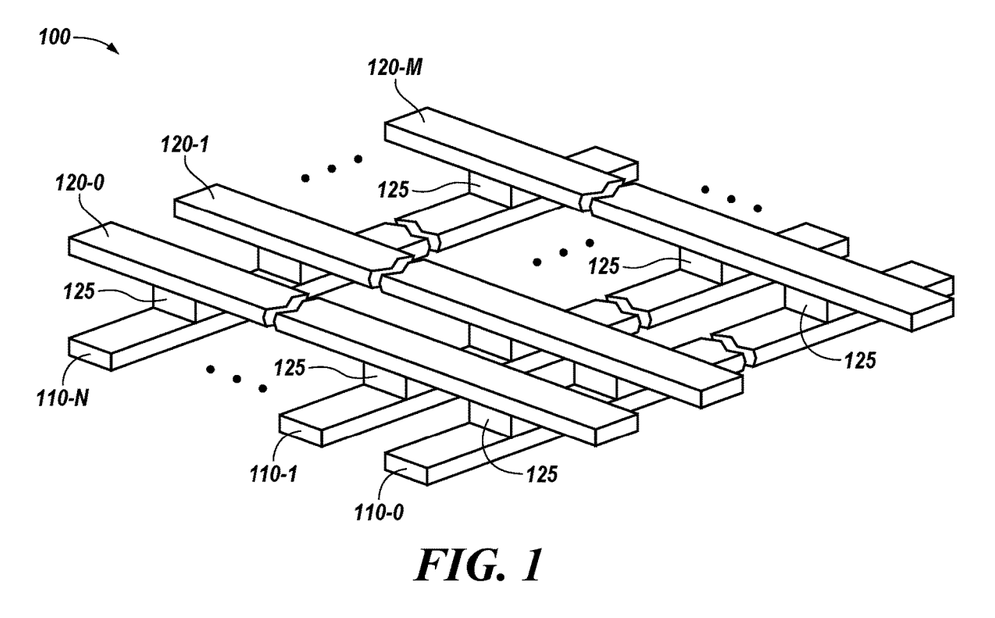
FIG. 1 is a three-dimensional view of an example of a memory array, in accordance with an embodiment of the present disclosure.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
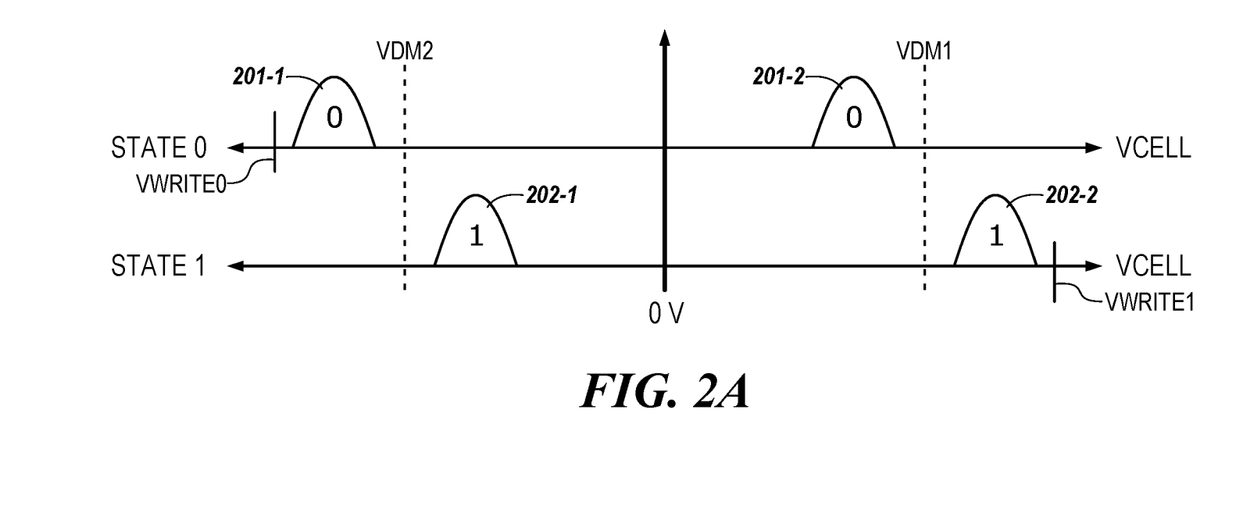
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
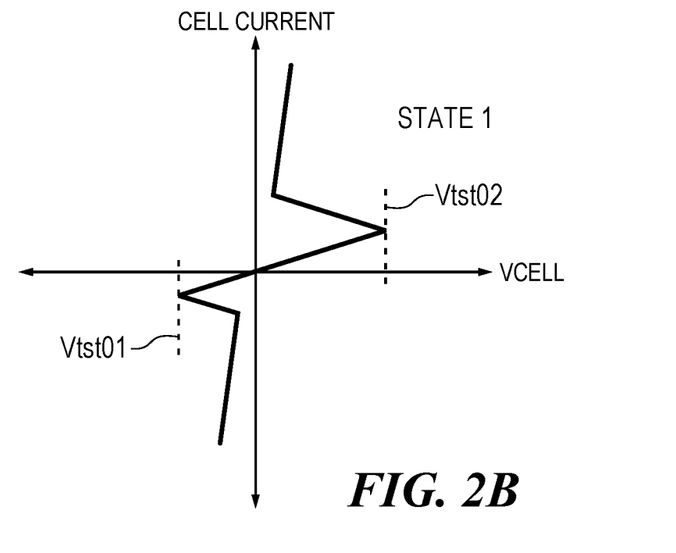
FIG. 2B is an example of a current-versus-voltage curve corresponding to a memory state of FIG. 2A, in accordance with an embodiment of the present disclosure.
Figure 2C:
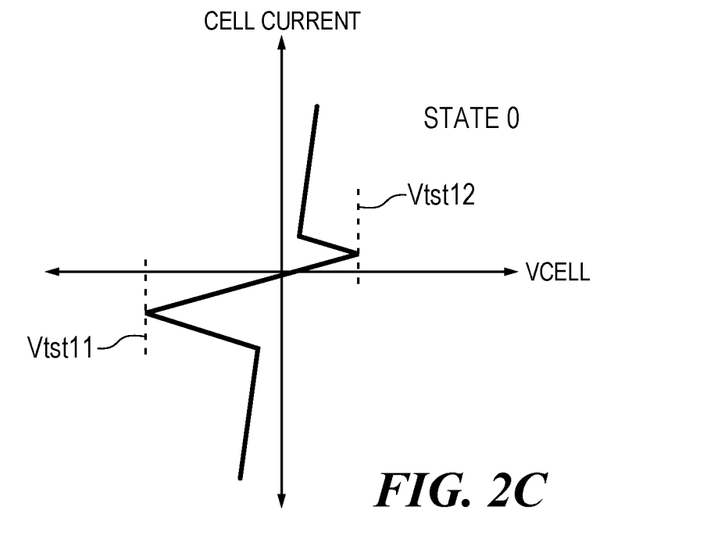
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

Figure 3:
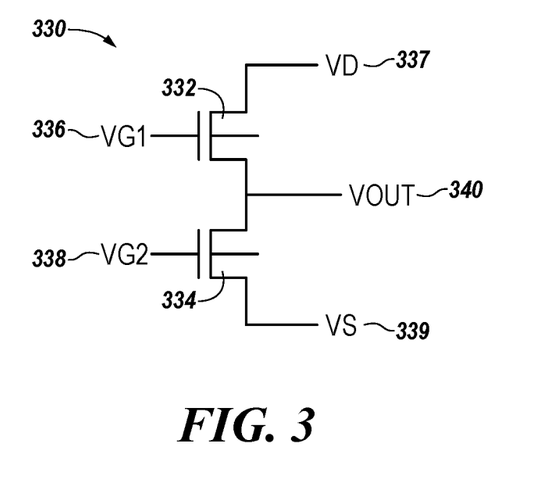
FIG. 3 illustrates decoder circuitry, in accordance with an embodiment of the present disclosure.

FIG. 3 illustrates decoder circuitry 330, in accordance with an embodiment of the present disclosure. As shown in FIG. 3, the decoder circuitry 330 can include two-n-type transistors 332 and 334. The two-n-type transistors may have a positive configuration and a negative configuration (e.g., can be bipolar).

The decoder circuitry 330 can include a first n-type transistor 332, which includes a first gate, and a second n-type transistor 334, which includes a second gate. Each of the first transistor 332 and the second transistor 334 can include a respective n-type channel. While only a single set of two-n-type transistors is illustrated, various numbers of n-type transistors, in sets of two, can be utilized. For instance, each respective word line and/or respective bit line of a memory array (e.g., memory array 100 described in connection with FIG. 1) may be coupled to a respective set of two-n-type transistors.

Memory devices, in accordance with embodiments of the present disclosure, can include memory cells that can be accessed by providing a voltage across the memory cell, where the data value stored by the cell is based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of such a memory cell is a cross-point memory cell, as previously described herein (e.g., in connection with FIGS. 1 and 2A-2C).

For such memories, word lines and bit lines (word lines 110 and bit lines 120 previously described in connection with FIG. 1) can be used to provide selection signals and/or de-selection signals to respective memory cells. The selection signals may include signals characterized by voltage levels used for various operations (e.g., a write operation or a read operation) being performed on the memory cells. The word lines and bit lines may couple to selection and de-selection signal sources through decoding circuitry (e.g., decoder circuitry 330). That is, decoder circuitry 330 can be used to provide the selection and de-selection signals to the memory cells via the word lines and bit lines.

Decoder circuitry 330 can provide the selection and de-selection signals to the memory cells in response to bias conditions (e.g., a number of voltages) being provided to the decoder circuitry 330. For instance, bias conditions can be respectively provided to the first gate of the first transistor 332 and the second gate of the second transistor 334 by pre-decoder circuitry, as will be discussed further herein. The bias condition provided to the first gate of the first transistor 332 can be a first voltage 336, which may be referred to as VG1. The bias condition provided to the second gate of the second transistor 334 can be a second voltage 338, which may be referred to as VG2. Embodiments provide that the first voltage (VG1) 336 and the second voltage (VG2) 338 can be provided by the pre-decoder circuitry discussed further herein. In other words, the pre-decoder circuitry, discussed further herein, can be utilized to control the bias conditions provided to the decoder circuitry 330, which in turn controls the selection signals and/or de-selection signals provided to the memory cells.

Additionally, a number of other voltages (e.g., supply voltages) may be provided to the decoder circuitry 330. As shown in FIG. 3, a first supply voltage 337, which may be referred to as VD, may be provided to the first transistor 332. A second supply voltage 339, which may be referred to as VS, may be provided to the second transistor 334.

Decoder circuitry 330 can provide an output voltage 340, which may be referred to as VOUT. The output voltage 340 may be a voltage that is provided to a word line and/or a bit line (e.g., during a read or write operation). The decoder circuitry 330 output voltage 340 may be selection signal (e.g., such that a memory cell is selected during an operation, such as a read operation or a write operation). The decoder circuitry 330 output voltage 340 may be de-selection signal (e.g., such that a memory cell is de-selected (e.g., is not selected) during an operation, such as a read operation or a write operation).

The decoder circuitry 330 can provide the output voltage 340 for a positive configuration (e.g., positive configuration selection signals and positive configuration de-selection signals) of the memory cells and for a negative configuration (e.g., negative configuration selection signals and negative configuration de-selection signals) of the memory cells. Various bias conditions (e.g., voltages) VG1 336, VG2 338, VD, 337, and VS 339 may be utilized to provide the differing output voltages 340.

One or more embodiments provide that VG1 336 may be a positive voltage, zero volts, or a negative voltage. The VG1 positive voltage and the VG1 negative voltage may have various values for differing applications. As an example, the VG1 positive voltage may have a value of 5.5 V and the VG1 negative voltage may have a value of −3.4 V.

One or more embodiments provide that VG2 338 may be a positive voltage or a negative voltage. The VG2 positive voltage and the VG2 negative voltage may have various values for differing applications. As an example, the VG2 positive voltage may have a value of 2.5 V and the VG2 negative voltage may have a value of −3.4 V. One or more embodiments provide that the VG2 positive voltage has a magnitude less that is less than a magnitude of the VG1 positive voltage. One or more embodiments provide that the VG2 negative voltage has a magnitude that is equal to a magnitude of the VG1 negative voltage.

One or more embodiments provide that VD 337 may be a positive voltage, zero volts, or a negative voltage. The VD positive voltage and the VD negative voltage may have various values for differing applications. As an example, the VD positive voltage may have a value of 3.4 V and the VD negative voltage may have a value of −3.4 V. One or more embodiments provide that the VD positive voltage has a magnitude less that is less than a magnitude of the VG1 positive voltage and is greater than a magnitude of the VG2 positive voltage. One or more embodiments provide that the VD negative voltage has a magnitude that is equal to a magnitude of the VG1 negative voltage and is equal to a magnitude of the VG2 negative voltage.

One or more embodiments provide that VS 339 may be zero volts or a cell bias voltage (e.g., when enabled).

As mentioned, the decoder circuitry 330 can provide the output voltage 340 for a positive configuration (e.g., positive configuration selection signals and positive configuration de-selection signals) of the memory cells. Embodiments provide that the positive configuration can have four modes, where one mode provides a selection signal, and three modes provide de-selection signals.

To provide a positive configuration selection signal, the VG1 336 positive voltage may be utilized with the VG2 338 negative voltage, where the VD 337 positive voltage is utilized, and the VS 339 is zero volts. Utilizing these voltage values can provide that the VD 337 positive voltage is provided as VOUT 340 (e.g., the positive configuration selection signal). As an example, if the VG1 336 positive voltage is 5.5 V, the VG2 338 negative voltage is −3.4 V, the VD 337 positive voltage is 3.4 V, and VS 339 is zero V, then the VOUT 340 will be 3.4 V. Embodiments provide that a magnitude of the VG1 336 positive voltage can be greater than a magnitude of a gate threshold voltage value for the corresponding gate. Embodiments provide that a magnitude of the VG2 338 negative voltage can be greater than a magnitude of a gate threshold voltage value for the corresponding gate. Embodiments provide that a magnitude of the VG1 336 positive voltage can be greater than a magnitude of the VG2 338 negative voltage.

To provide a first of the three positive configuration de-selection signals (e.g., a local de-selection signal), the VG1 336 negative voltage may be utilized with the VG2 338 positive voltage, where the VD 337 positive voltage is utilized, and the VS 339 is zero volts. Utilizing these voltage values can provide that the VS 339 zero volts is provided as VOUT 340 (e.g., a positive configuration de-selection signal). As an example, if the VG1 336 negative voltage is −3.4 V, the VG2 338 positive voltage is 2.5 V, the VD 337 positive voltage is 3.4 V, and VS 339 is zero V, then the VOUT 340 will be zero V. The magnitude of the different positive voltage for the second gate (e.g., 2.5 V) is less than a magnitude of the positive voltage for the first gate (e.g., 5.5 V) as previously mentioned.

To provide a second of three positive configuration de-selection signals, the VG1 336 positive voltage may be utilized with the VG2 338 negative voltage, where the VD 337 zero volts is utilized, and the VS 339 is zero volts. Utilizing these voltage values can provide that the VD 337 zero volts is provided as VOUT 340 (a positive configuration de-selection signal). As an example, if the VG1 336 positive voltage is 5.5 V, the VG2 338 negative voltage is −3.4 V, the VD 337 is zero V, and VS 339 is zero V, then the VOUT 340 will be zero V.

To provide a third of three positive configuration de-selection signals (e.g., a global and local de-selection signal), the VG1 336 negative voltage may be utilized with the VG2 338 positive voltage, where the VD 337 zero volts is utilized, and the VS 339 is zero volts. Utilizing these voltage values can provide that the VS 339 zero volts is provided as VOUT 340 (e.g., a positive configuration de-selection signal). As an example, if the VG1 336 negative voltage is −3.4 V, the VG2 338 positive voltage is 2.5 V, the VD 337 is zero V, and VS 339 is zero V, then the VOUT 340 will be zero V.

As mentioned, the decoder circuitry 330 can provide the output voltage 340 for a negative configuration (e.g., negative configuration selection signals and negative configuration de-selection signals) of the memory cells. Embodiments provide that the negative configuration can have four modes, where one mode provides a selection signal, and three modes provide de-selection signals.

To provide a negative configuration selection signal, the VG1 336 zero volts may be utilized with the VG2 338 negative voltage, where the VD 337 negative voltage is utilized, and the VS 339 is zero volts. Utilizing these voltage values can provide that the VD 337 negative voltage is provided as VOUT 340 (e.g., the negative configuration selection signal). As an example, if the VG1 336 is zero V, the VG2 338 negative voltage is −3.4 V, the VD 337 negative voltage is −3.4 V, and VS 339 is zero V, then the VOUT 340 will be −3.4 V.

To provide a first of the three negative configuration de-selection signals (e.g., a local de-selection signal), the VG1 336 negative voltage may be utilized with the VG2 338 positive voltage, where the VD 337 negative voltage is utilized, and the VS 339 is zero volts. Utilizing these voltage values can provide that the VS 339 zero volts is provided as VOUT 340 (a negative configuration de-selection signal). As an example, if the VG1 336 negative voltage is −3.4 V, the VG2 338 positive voltage is 2.5 V, the VD 337 negative voltage is −3.4 V, and VS 339 is zero V, then the VOUT 340 will be zero V.

To provide a second of the three negative configuration de-selection signals (e.g., a global de-selection signal), the VG1 336 zero volts may be utilized with the VG2 338 negative voltage, where the VD 337 zero volts is utilized, and the VS 339 is zero volts. Utilizing these voltage values can provide that the VG1 336 zero volts is provided as VOUT 340 (e.g., a negative configuration de-selection signal). As example, if the VG1 336 is zero V, the VG2 338 negative voltage is −3.4 V, the VD 337 is zero V, and VS 339 is zero V, then the VOUT 340 will be zero V.

To provide a third of the three negative configuration de-selection signals (e.g., a global and local de-selection signal), the VG1 336 negative voltage may be utilized with the VG2 338 positive voltage, where the VD 337 zero volts is utilized, and the VS 339 is zero volts. Utilizing these voltage values can provide that the VS 339 zero volts is provided as VOUT 340 (e.g., a negative configuration de-selection signal). As example, if the VG1 336 negative voltage is −3.4 V, the VG2 338 positive voltage is 2.5 V, the VD 337 is zero V, and VS 339 is zero V, then the VOUT 340 will be zero V.

Figure 4:
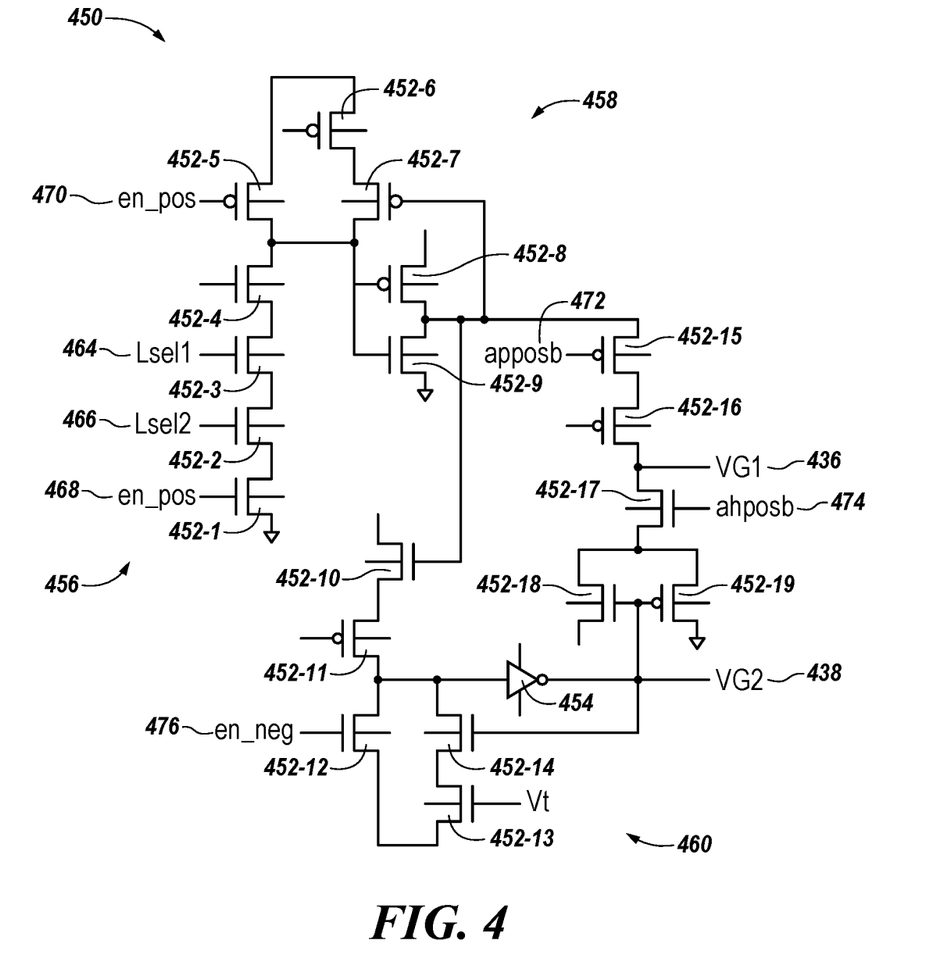
FIG. 4 illustrates pre-decoder circuitry, in accordance with an embodiment of the present disclosure.

FIG. 4 illustrates pre-decoder circuitry 450, in accordance with an embodiment of the present disclosure. As mentioned, the pre-decoder circuitry 450 can provide a bias condition for the first gate of the first n-type transistor and the second gate of the second n-type transistor of decoder circuitry 330, shown in FIG. 3.

As shown in FIG. 4, the pre-decoder circuitry 450 can include a plurality of transistors 452-1, 452-2, . . . 452-19. The pre-decoder circuitry 450 can include an inverter 454. The plurality of transistors 452-1, 452-2, . . . 452-19 an the inverter 454 can be configured (e.g., coupled) as shown in FIG. 4. However, other configurations may be utilized.

Embodiments provide that a number of the plurality transistors can be n-type transistors. For instance, as shown in FIG. 4, transistors 452-1, 452-2, 452-3, 452-4, 452-9, 452-10, 452-12, 452-13, 452-14, 452-17, 452-18 can be n-type transistors. Embodiments provide that a number of the plurality transistors can be p-type transistors. For instance, as shown in FIG. 4, transistors 452-5, 452-6, 452-7, 452-8, 452-11, 452-15, 452-16, 452-19 can be p-type transistors.

A portion of the pre-decoder circuitry 450 may be referred to as a decoding portion 456 of the pre-decoder circuitry 450. The decoding portion 456 can include a number of transistors. For instance, the decoding portion 456 can include transistors 452-1, 452-2, 452-3. As discussed further herein, the decoding portion 456 can be configured to receive pre-decoded address signals having pre-decoded voltage values and receive enable signals having enable voltage values.

A portion of the pre-decoder circuitry 450 may be referred to as a first level shift portion 458 of the pre-decoder circuitry 450. The first level shift portion 458 can include a number of transistors. For instance, the first level shift portion 458 can include transistors 452-5, 452-6, 452-7, 452-8, 452-9. As discussed further herein, the first level shift portion 458 can be configured to shift (e.g. increase or decrease) a received pre-decoded voltage value to provide a bias condition (e.g., VG1 436).

A portion of the pre-decoder circuitry 450 may be referred to as a second level shift portion 460 of the pre-decoder circuitry 450. The second level shift portion 460 can include a number of transistors and an inverter. For instance, the second level shift portion 460 can include transistors 452-12, 452-13, 452-14 and inverter 454. As discussed further herein, the second level shift portion 460 can be configured to shift (e.g., increase or decrease) a received pre-decoded voltage value to provide a bias condition (e.g., VG2 438).

The pre-decoder circuitry 450 can provide the bias conditions (e.g., VG1, VG2) for positive configuration selection signals and positive configuration de-selection signals, and can provide the bias conditions (e.g., VG1, VG2) for negative configuration selection signals and negative configuration de-selection signals. Embodiments provide that the positive configuration can have two modes, where one mode provides bias conditions (e.g., VG1, VG2) for a selection signal, and one mode provides bias conditions (e.g., VG1, VG2) for de-selection signal. Embodiments further provide that the negative configuration can have two modes, where one mode provides bias conditions (e.g., VG1, VG2) for a selection signal, and one mode provides bias conditions (e.g., VG1, VG2) for de-selection signal.

For the positive configuration providing bias conditions (e.g., VG1, VG2) for a selection signal, a pre-decoded address signal 464 (Lsel1) can be provided to a gate of a first transistor 452-3 of the pre-decoder circuitry 450 (e.g., of the decoding portion 456). As used herein a "pre-decoded address signal" refers to a signal provided from other circuitry to the pre-decoder circuitry 450. For instance, pre-decoded address signals may be provided from a first level pre-decoder circuitry (not shown) to the pre-decoder circuitry 450, which may be referred to as a second level pre-decoder circuitry. The pre-decoded address signal 464 can have a high voltage value, as compared to pre-decoded address signals having a relatively lower voltage value. Various high voltage values can be utilized for different applications. As an example, the pre-decoded address signal 464 can have a high voltage value of 1.2 V.

Additionally, for the positive configuration providing bias conditions (e.g., VG1, VG2) for the selection signal, a pre-decoded address signal 466 (Lsel2) can be provided to a gate of a second transistor 452-2 of the pre-decoder circuitry 450 (e.g., of the decoding portion 456). The pre-decoded address signal 466 can have the high voltage value (e.g., the same high voltage value as Lsel1). Various high voltage values can be utilized for different applications. As an example, the pre-decoded address signal 466 can have a high voltage value of 1.2 V.

Additionally, for the positive configuration providing bias conditions (e.g., VG1, VG2) for the selection signal, an enable signal 468 (en_pos) can be provided to a gate of a third transistor 452-1 of the pre-decoder circuitry 450 (e.g., of the decoding portion 456). The enable signal 468 can have a high voltage value, as compared to enable signals having a relatively lower voltage value. Various high voltage values can be utilized for different applications. As an example, the enable signal 468 can have a high voltage value of 5.5 V. As shown in FIG. 4, the high voltage value 470 (en_pos) (e.g., the same as the high voltage value 468) can be provided to a gate of a fourth transistor 452-5 of the pre-decoder circuitry 450.

Additionally, for the positive configuration providing bias conditions (e.g., VG1, VG2) for the selection signal, a low voltage value 472 (apposb), as compared to a relatively higher voltage value, can be applied to a gate of transistor 452-15 of the pre-decoder circuitry 450. Various low voltage values can be utilized for different applications. As an example, the low voltage value 472 can have a low voltage value of zero V. As shown in FIG. 4, a low voltage value 474 (ahposb) (e.g., the same as the low voltage value 472) can be provided to a gate of transistor 452-17 of the pre-decoder circuitry 450.

For the positive configuration providing bias conditions (e.g., VG1, VG2) for the selection signal, the first level shift portion 458 can increase the pre-decoded high voltage value (e.g., pre-decoded address signal 466 and/or pre-decoded address signal 468) to provide a positive voltage 436 (VG1), such as 5.5 V. As discussed, the bias condition (e.g., positive voltage 436) can be provided to a gate of a transistor (e.g., transistor 332 of the decoder circuitry 330 to provide the selection signal (output voltage 340), shown in FIG. 3).

For the positive configuration providing bias conditions (e.g., VG1, VG2) for the selection signal, the second level shift portion 460 can decrease the pre-decoded high voltage value (e.g., pre-decoded address signal 466 and/or pre-decoded address signal 468) to provide a negative voltage 438 (VG2), such as −3.4 V. As discussed, the bias condition (e.g., negative voltage 438) can be provided to a gate of a transistor (e.g., transistor 334 of the decoder circuitry 330 to provide the selection signal (output voltage 340), shown in FIG. 3). Additionally, a low voltage value 476 (en_neg), as compared to a relatively higher voltage value, can be applied to the gate of transistor 452-12 of the second level shift portion 460. Various low voltage values can be utilized for different applications. As an example, the low voltage value 476 can have a low voltage value of −3.4 V.

For the positive configuration providing bias conditions (e.g., VG1, VG2) for a de-selection signal, a pre-decoded address signal 464 (Lsel1) can be provided to a gate of a first transistor 452-3 of the pre-decoder circuitry 450 (e.g., of the decoding portion 456). The pre-decoded address signal 464 can have a low voltage value, as compared to pre-decoded address signals having a relatively higher voltage value. Various low voltage values can be utilized for different applications. As an example, the pre-decoded address signal 464 can have a low voltage value of zero V.

Additionally, for the positive configuration providing bias conditions (e.g., VG1, VG2) for the de-selection signal, a pre-decoded address signal 466 (Lsel2) can be provided to a gate of a second transistor 452-2 of the pre-decoder circuitry 450 (e.g., of the decoding portion 456). The pre-decoded address signal 466 can have the low voltage value (e.g., the same low voltage value as Lsel1). As an example, the pre-decoded address signal 466 can have a low voltage value of zero V.

Embodiments provide that when either the pre-decoded address signal 464 or the pre-decoded address signal 466 have the low voltage value, then the positive configuration de-selection signal will be generated. Further, embodiments provide that when both the pre-decoded address signal 464 and the pre-decoded address signal 466 have the low voltage value, then the positive configuration de-selection signal will be generated.

Additionally, for the positive configuration providing bias conditions (e.g., VG1, VG2) for the de-selection signal, an enable signal 468 (en_pos) can be provided to a gate of a third transistor 452-1 of the pre-decoder circuitry 450 (e.g., of the decoding portion 456). The enable signal 468 can have a low voltage value, as comped to enable signals having a relatively higher voltage value. Various low voltage values can be utilized for different applications. As an example, the enable signal 468 can have a low voltage value of zero V. As shown in FIG. 4, the low voltage value 470 (en_pos) (e.g., the same as the low voltage value 468) can be provided to a gate of a fourth transistor 452-5 of the pre-decoder circuitry 450.

Additionally, for the positive configuration providing bias conditions (e.g., VG1, VG2) for the de-selection signal, a low voltage value 472 (apposb), as compared to a relatively higher voltage value, can be applied to the gate of transistor 452-15 of the pre-decoder circuitry 450. Various low voltage values can be utilized for different applications. As an example, the low voltage value 472 can have a low voltage value of zero V. As shown in FIG. 4, the low voltage value 474 (ahposb) (e.g., the same as the low voltage value 472) can be provided to a gate of transistor 452-17 of the pre-decoder circuitry 450.

For the positive configuration providing bias conditions (e.g., VG1, VG2) for the de-selection signal, the first level shift portion 458 can decrease the pre-decoded high voltage value (e.g., pre-decoded address signal 466 and/or pre-decoded address signal 468) to provide a negative voltage 436 (VG1), such as −3.4 V. As discussed, the bias condition (e.g., negative voltage 436) can be provided to a gate of a transistor (e.g., transistor 332 of the decoder circuitry 330 to provide the de-selection signal (output voltage 340), shown in FIG. 3).

For the positive configuration providing bias conditions (e.g., VG1, VG2) for the de-selection signal, the second level shift portion 460 can increase the pre-decoded high voltage value (e.g., pre-decoded address signal 466 and/or pre-decoded address signal 468) to provide a positive voltage 438 (VG2), such as 2.5 V. As discussed, the bias condition (e.g., positive voltage 438) can be provided to a gate of a transistor (e.g., transistor 334 of the decoder circuitry 330 to provide the de-selection signal (output voltage 340), shown in FIG. 3). Additionally, a low voltage value 476 (en_neg), as compared to a relatively higher voltage value, can be applied to the gate of transistor 452-12 of the second level shift portion 460. Various low voltage values can be utilized for different applications. As an example, the low voltage value 476 can have a low voltage value of −3.4 V.

For the negative configuration providing bias conditions (e.g., VG1, VG2) for a selection signal, a pre-decoded address signal 464 (Lsel1) can be provided to a gate of a first transistor 452-3 of the pre-decoder circuitry 450 (e.g., of the decoding portion 456). The pre-decoded address signal 464 can have a high voltage value, as compared to pre-decoded address signals having a relatively lower voltage value. Various high voltage values can be utilized for different applications. As an example, the pre-decoded address signal 464 can have a high voltage value of 1.2 V.

Additionally, for the negative configuration providing bias conditions (e.g., VG1, VG2) for the selection signal, a pre-decoded address signal 466 (Lsel2) can be provided to a gate of a second transistor 452-2 of the pre-decoder circuitry 450 (e.g., of the decoding portion 456). The pre-decoded address signal 466 can have the high voltage value (e.g., the same high voltage value as Lsel1). As an example, the pre-decoded address signal 466 can have a high voltage value of 1.2 V.

Additionally, for the negative configuration providing bias conditions (e.g., VG1, VG2) for the selection signal, an enable signal 468 (en_pos) can be provided to a gate of a third transistor 452-1 of the pre-decoder circuitry 450 (e.g., of the decoding portion 456). The enable signal 468 can have a high voltage value, as compared to enable signals having a relatively lower voltage value. Various high voltage values can be utilized for different applications. As an example, the enable signal 468 can have a high voltage value of 5.5 V. As shown in FIG. 4, the high voltage value 470 (en_pos) (e.g., the same as the high voltage value 468) can be provided to a gate of a fourth transistor 452-5 of the pre-decoder circuitry 450.

Additionally, for the negative configuration providing bias conditions (e.g., VG1, VG2) for the selection signal, a high voltage value 472 (apposb), as compared to a relatively lower voltage value, can be applied to the gate of transistor 452-15 of the pre-decoder circuitry 450. Various high voltage values can be utilized for different applications. As an example, the high voltage value 472 can have a high voltage value of 5.5 V. As shown in FIG. 4, a positive voltage value 474 (ahposb) having a lower magnitude than apposb (e.g., 2.5 V) can be provided to a gate of transistor 452-17 of the pre-decoder circuitry 450.

For the negative configuration providing bias conditions (e.g., VG1, VG2) for the selection signal, the first level shift portion 458 can decrease the pre-decoded high voltage value (e.g., pre-decoded address signal 466 and/or pre-decoded address signal 468) to provide zero volts 436 (VG1). As discussed, the bias condition (e.g., zero volts 436) can be provided to a gate of a transistor (e.g., transistor 332 of the decoder circuitry 330 to provide the selection signal (output voltage 340), shown in FIG. 3).

For the negative configuration providing bias conditions (e.g., VG1, VG2) for the selection signal, the second level shift portion 460 can decrease the pre-decoded high voltage value (e.g., pre-decoded address signal 466 and/or pre-decoded address signal 468) to provide a negative voltage 438 (VG2), such as −3.4 V. As discussed, the bias condition (e.g., negative voltage 438) can be provided to a gate of a transistor (e.g., transistor 334 of the decoder circuitry 330 to provide the selection signal (output voltage 340), shown in FIG. 3). Additionally, a low voltage value 476 (en_neg), as compared to a relatively higher voltage value, can be applied to the gate of transistor 452-12 of the second level shift portion 460. Various low voltage values can be utilized for different applications. As an example, the low voltage value 476 can have a low voltage value of −3.4 V.

For the negative configuration providing bias conditions (e.g., VG1, VG2) for a de-selection signal, a pre-decoded address signal 464 (Lsel1) can be provided to a gate of a first transistor 452-3 of the pre-decoder circuitry 450 (e.g., of the decoding portion 456). The pre-decoded address signal 464 can have a low voltage value, as compared to pre-decoded address signals having a relatively higher voltage value. Various low voltage values can be utilized for different applications. As an example, the pre-decoded address signal 464 can have a low voltage value of zero V.

Additionally, for the negative configuration providing bias conditions (e.g., VG1, VG2) for the de-selection signal, a pre-decoded address signal 466 (Lsel2) can be provided to a gate of a second transistor 452-2 of the pre-decoder circuitry 450 (e.g., of the decoding portion 456). The pre-decoded address signal 466 can have the low voltage value (e.g., the same low voltage value as Lsel1). As an example, the pre-decoded address signal 466 can have a low voltage value of zero V.

Embodiments provide that when either the pre-decoded address signal 464 or the pre-decoded address signal 466 have the low voltage value, then the negative configuration de-selection signal will be generated. Further, embodiments provide that when both the pre-decoded address signal 464 and the pre-decoded address signal 466 have the low voltage value, then the negative configuration de-selection signal will be generated.

Additionally, for the negative configuration providing bias conditions (e.g., VG1, VG2) for the de-selection signal, an enable signal 468 (en_pos) can be provided to a gate of a third transistor 452-1 of the pre-decoder circuitry 450 (e.g., of the decoding portion 456). The enable signal 468 can have a low voltage value, as comped to enable signals having a relatively higher voltage value. Various low voltage values can be utilized for different applications. As an example, the enable signal 468 can have a low voltage value of zero V. As shown in FIG. 4, the low value 470 (en_pos) (e.g., the same as the low voltage value 468) can be provided to a gate of a fourth transistor 452-5 of the pre-decoder circuitry 450.

Additionally, for the negative configuration providing bias conditions (e.g., VG1, VG2) for the de-selection signal, a high voltage value 472 (apposb), as compared to a relatively lower voltage value, can be provided to the gate of transistor 452-15 of the pre-decoder circuitry 450. Various high voltage values can be utilized for different applications. As an example, the high voltage value 472 can have a high voltage value of 5.5 V. As shown in FIG. 4, positive voltage value 474 (ahposb) having a lower magnitude than apposb (e.g., 2.5 V) can be provided to a gate of transistor 452-17 of the pre-decoder circuitry 450.

For the negative configuration providing bias conditions (e.g., VG1, VG2) for the de-selection signal, the first level shift portion 458 can decrease the pre-decoded high voltage value (e.g., pre-decoded address signal 466 and/or pre-decoded address signal 468) to provide a negative voltage 436 (VG1), such as −3.4 V. As discussed, the bias condition (e.g., negative voltage 436) can be provided to a gate of a transistor (e.g., transistor 332 of the decoder circuitry 330 to provide the de-selection signal (output voltage 340), shown in FIG. 3).

For the negative configuration providing bias conditions (e.g., VG1, VG2) for the de-selection signal, the second level shift portion 460 can increase the pre-decoded low voltage value (e.g., pre-decoded address signal 466 and/or pre-decoded address signal 468) to provide a positive voltage 438 (VG2), such as 2.5 V. As discussed, the bias condition (e.g., positive voltage 438) can be provided to a gate of a transistor (e.g., transistor 334 of the decoder circuitry 330 to provide the de-selection signal (output voltage 340), shown in FIG. 3). Additionally, a high voltage value 476 (en_neg), as compared to a relatively lower voltage value, can be applied to the gate of transistor 452-12 of the second level shift portion 460. Various high voltage values can be utilized for different applications. As an example, the high voltage value 476 can have a high voltage value of zero V.

Figure 5:
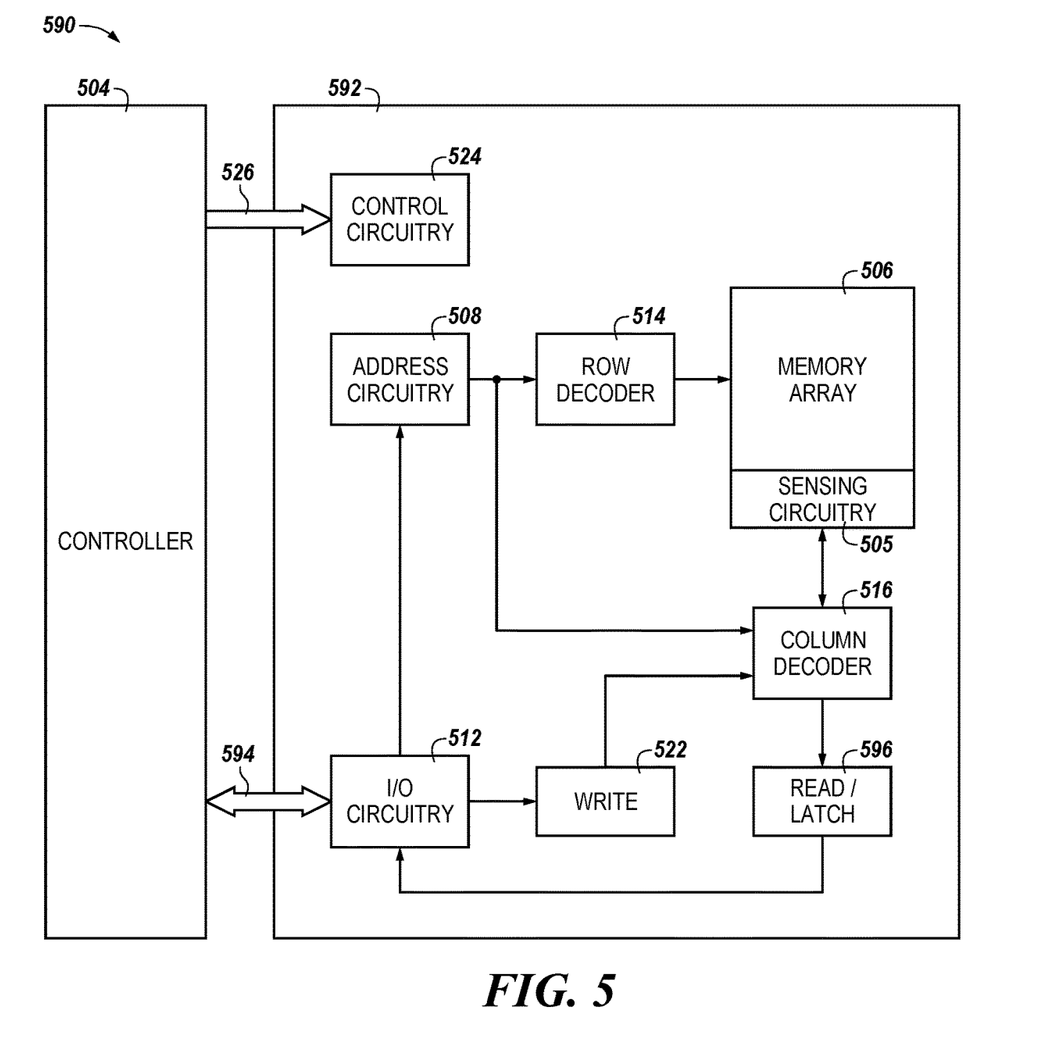
FIG. 5 is a block diagram illustration of an example apparatus, in accordance with an embodiment of the present disclosure.

FIG. 5 is a block diagram illustration of an example apparatus, such as an electronic memory system 590, in accordance with an embodiment of the present disclosure. Memory system 590 may include an apparatus, such as a memory device 592 and a controller 504, such as a memory controller (e.g., a host controller). Controller 504 might include a processor, for example. Controller 504 might be coupled to a host, for example, and may receive command signals (or commands), address signals (or addresses), and data signals (or data) from the host and may output data to the host.

Memory device 592 includes a memory array 506 of memory cells. For example, memory array 506 may include one or more of the memory arrays, such as a cross-point array, of memory cells disclosed herein. Memory device 592 may include address circuitry 508 to latch address signals provided over I/O connections 594 through I/O circuitry 512. Address signals may be received and decoded by a row decoder 514 and a column decoder 516 to access the memory array 506. For example, row decoder 514 and/or column decoder 516 may include drivers, and may include decoder circuitry 330 and pre-decoder circuitry 450 previously described in connection with FIGS. 3 and 4, respectively.

Memory device 592 may sense (e.g., read) data in memory array 506 by sensing voltage and/or current changes in the memory array columns using sense/buffer circuitry that in some examples may be read/latch circuitry 596. Read/latch circuitry 596 may read and latch data from the memory array 506. Sensing circuitry 505 may include a number of sense amplifiers coupled to memory cells of memory array 506, which may operate in combination with the read/latch circuitry 596 to sense (e.g., read) memory states from targeted memory cells. I/O circuitry 512 may be included for bi-directional data communication over the I/O connections 594 with controller 504. Write circuitry 522 may be included to write data to memory array 506.

Control circuitry 524 may decode signals provided by control connections 526 from controller 504. These signals may include chip signals, write enable signals, and address latch signals that are used to control the operations on memory array 506, including data read and data write operations.

Control circuitry 524 may be included in controller 504, for example. Controller 504 may include other circuitry, firmware, software, or the like, whether alone or in combination. Controller 504 may be an external controller (e.g., in a separate die from the memory array 506, whether wholly or in part) or an internal controller (e.g., included in a same die as the memory array 506). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. he scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory array including a plurality of memory cells;
decoder circuitry coupled to the memory array, wherein the decoder circuitry comprises a first n-type transistor having a first gate and a second n-type transistor having a second gate; and
pre-decoder circuitry configured to provide a bias condition for the first gate and second gate to provide a selection signal to one of the plurality of memory cells, wherein the bias condition comprises:
a positive voltage for the first gate and a negative voltage for the second gate for a positive configuration for the memory cells; and
zero volts for the first gate and the negative voltage for the second gate for a negative configuration for the memory cells.

2. The apparatus of claim 1, wherein the pre-decoder circuitry is configured to provide an additional bias condition for the first gate and the second gate to provide a de-selection signal to the one of the plurality of memory cells for the positive configuration, wherein the additional bias condition comprises the negative voltage for the first gate and a different positive voltage for the second gate.

3. The apparatus of claim 2, wherein a magnitude of the different positive voltage for the second gate is less than a magnitude of the positive voltage for the first gate.

4. The apparatus of claim 1, wherein the pre-decoder circuitry is configured to provide an additional bias condition for the first gate and second gate to provide a de-selection signal to the one of the plurality of memory cells for the negative configuration, wherein the additional bias condition comprises the negative voltage for the first gate and a different positive voltage for the second gate.

5. The apparatus of claim 1, wherein a magnitude of the positive voltage for the first gate is greater than a magnitude of a gate threshold voltage value.

6. The apparatus of claim 1, wherein a magnitude of the negative voltage for the second gate is greater than a magnitude of a gate threshold voltage value.

7. The apparatus of claim 1, wherein a magnitude of the positive voltage for the first gate is greater than a magnitude of the negative voltage for the second gate.

8. A method of operating memory, comprising:
providing a first positive configuration pre-decoded address signal to a gate of a first transistor of pre-decoder circuitry, wherein the first positive configuration pre-decoded address signal has a high voltage value or a low voltage value;
providing a second positive configuration pre-decoded address signal to a gate of a second transistor of the pre-decoder circuitry, wherein the second positive configuration pre-decoded address signal has the high voltage value or the low voltage value; and
providing a positive configuration de-selection bias condition for a first gate of a first n-type transistor of decoder circuitry and a second gate of a second n-type transistor of the decoder circuitry when the first positive configuration pre-decoded address signal has the low voltage value or when the second positive configuration pre-decoded address signal has the low voltage value.

9. The method of claim 8, wherein the method includes providing the positive configuration de-selection bias condition for the first gate of the first n-type transistor of the decoder circuitry and the second gate of the second n-type transistor of the decoder circuitry when the first positive configuration pre-decoded address signal has the low voltage value and when the second positive configuration pre-decoded address signal has the low voltage value.

10. The method of claim 8, wherein the method includes providing a positive configuration selection bias condition to the first gate of the first n-type transistor of the decoder circuitry and the second gate of the second n-type transistor of the decoder circuitry when the first positive configuration pre-decoded address signal has the high voltage value and when the second positive configuration pre-decoded address signal has the high voltage value.

11. A method of operating memory, comprising:
providing a first negative configuration pre-decoded address signal to a gate of a first transistor of pre-decoder circuitry, wherein the first negative configuration pre-decoded address signal has a high voltage value or a low voltage value;
providing a second negative configuration pre-decoded address signal to a gate of a second transistor of the pre-decoder circuitry, wherein the second negative configuration pre-decoded address signal has the high voltage value or the low voltage value; and
providing a negative configuration de-selection bias condition for a first gate of a first n-type transistor of decoder circuitry and a second gate of a second n-type transistor of the decoder circuitry when the first negative configuration pre-decoded address signal has the low voltage value or when the second negative configuration pre-decoded address signal has the low voltage value.

12. The method of claim 11, wherein the method includes providing the negative configuration de-selection bias condition for the first gate of the first n-type transistor of the decoder circuitry and the second gate of the second n-type transistor of the decoder circuitry when the first negative configuration pre-decoded address signal has the low voltage value and when the second negative configuration pre-decoded address signal has the low voltage value.

13. The method of claim 11, wherein the method includes providing a negative configuration selection bias condition for the first gate of the first n-type transistor of the decoder circuitry and the second gate of the second n-type transistor of the decoder circuitry when the first negative configuration pre-decoded address signal has the high voltage value and when the second negative configuration pre-decoded address signal has the high voltage value.

14. An apparatus, comprising:
a memory array including a plurality of memory cells; and
decoder circuitry coupled to the array of memory cells, wherein the decoder circuitry comprises a first n-type transistor having a first gate and a second n-type transistor having a second gate; and pre-decoder circuitry configured to provide a bias condition for the first gate and second gate to provide a selection signal to one of the plurality of memory cells, wherein the pre-decoder circuitry includes a decoding portion, a first level shift portion, and a second level shift portion, wherein:
- a gate of a first transistor of the decoding portion is configured to receive a first pre-decoded address signal having a pre-decoded high voltage value relative to a pre-decoded low voltage value;
- a gate of a second transistor of the decoding portion is configured to receive a second pre-decoded address signal having the pre-decoded high voltage value;
- the first level shift portion is configured to increase the pre-decoded high voltage value to provide a positive voltage for the first gate;
- the second level shift portion is configured to decrease the pre-decoded high voltage value to provide a negative voltage for the second gate,
- wherein the bias condition provides a selection signal for a positive configuration for the array of memory cells.

15. The apparatus of claim 14, wherein:
the gate of the first transistor is configured to receive a third pre-decoded address signal having the pre-decoded low voltage value;
the gate of the second transistor is configured to receive a fourth pre-decoded address signal having the pre-decoded low voltage value;
the first level shift portion is configured to decrease the pre-decoded low voltage value to provide a negative voltage for the first gate; and
the second level shift portion is configured to increase the pre-decoded low voltage value to provide a positive voltage for the second gate,
wherein the bias condition provides a de-selection signal for the positive configuration for the array of memory cells.

16. The apparatus of claim 15, wherein:
the gate of the first transistor is configured to receive a fifth pre-decoded address signal having the pre-decoded high voltage value;
the gate of the second transistor is configured to receive a sixth pre-decoded address signal having the pre-decoded high voltage value;
the first level shift portion is configured to decrease the pre-decoded high voltage value to provide zero volts for the first gate; and
the second level shift portion is configured to decrease the pre-decoded high voltage value to provide a negative voltage for the second gate,
wherein the bias condition provides a selection signal for a negative configuration for the array of memory cells.

17. The apparatus of claim 16, wherein:
the gate of the first transistor is configured to receive a seventh pre-decoded address signal having the pre-decoded low voltage value;
the gate of the second transistor is configured to receive an eighth pre-decoded address signal having the pre-decoded low voltage value;
the first level shift portion is configured to decrease the pre-decoded low voltage value to provide a negative voltage for the first gate; and
the second level shift portion is configured to increase the negative configuration pre-decoded low voltage value to provide a positive voltage for the second gate,
wherein the bias condition provides a de-selection signal for the negative configuration for the array of memory cells.

18. The apparatus of claim 11, wherein the first transistor of the decoding portion and the second transistor of the decoding portion are serially connected.

19. The apparatus of claim 11, wherein a magnitude of the positive voltage is greater than a magnitude of the negative the voltage by at least a gate threshold voltage value.

20. The apparatus of claim 17, wherein:
a gate of a third transistor of the decoding portion is configured to receive an enable signal having an enable high voltage value relative to an enable low voltage value to provide the bias condition that provides the selection signal for the positive configuration or the bias condition that provides the selection signal for the negative configuration; and
the gate of the third transistor is configured to receive an enable signal having the enable low voltage value to provide the bias condition that provides the de-selection signal for the positive configuration or the bias condition that provides the de-selection signal for the negative configuration.

* * * * *